US011063448B2

(12) United States Patent
Klicpera et al.

(10) Patent No.: US 11,063,448 B2
(45) Date of Patent: Jul. 13, 2021

(54) METHODS AND SYSTEM FOR DYNAMICALLY MODIFYING CHARGING SETTINGS FOR A BATTERY ASSEMBLY

(71) Applicant: ZEBRA TECHNOLOGIES CORPORATION, Lincolnshire, IL (US)

(72) Inventors: Christopher P. Klicpera, Westbury, NY (US); Michael Robustelli, Smithtown, NY (US)

(73) Assignee: Zebra Technologies Corporation, Lincolnshire, IL (US)

( * ) Notice: Subject to any disclaimer, the term of this patent is extended or adjusted under 35 U.S.C. 154(b) by 135 days.

(21) Appl. No.: 16/572,076

(22) Filed: Sep. 16, 2019

(65) Prior Publication Data

US 2021/0083486 A1    Mar. 18, 2021

(51) Int. Cl.
*H02J 7/00* (2006.01)
*H01M 10/44* (2006.01)
(Continued)

(52) U.S. Cl.
CPC ....... *H02J 7/0021* (2013.01); *H01M 10/0525* (2013.01); *H01M 10/441* (2013.01);
(Continued)

(58) Field of Classification Search
CPC .... H02J 7/0021; H02J 7/007192; H02J 7/045; H01M 10/0525; H01M 10/441; H01M 10/443; H01M 10/446
(Continued)

(56) References Cited

U.S. PATENT DOCUMENTS 4,081,743 A * 3/1978 Madden ................. B07C 5/344
                                                       324/426
5,525,890 A * 6/1996 Iwatsu ............... G01R 31/3648
                                                       320/106
(Continued)

FOREIGN PATENT DOCUMENTS

TW    201346303 A    11/2013

OTHER PUBLICATIONS

International Search Report and Written Opinion for International Application No. PCT/US2020/041243 dated Nov. 24, 2020.

*Primary Examiner* — John T Trischler
(74) *Attorney, Agent, or Firm* — Yuri Astvatsaturov

(57) ABSTRACT

Methods and a system for dynamically modifying charging settings for a battery assembly are described. A first usage value and a second usage value for the battery assembly are received. A usage difference value for the battery assembly is determined by comparing the first usage value to the second usage value. The usage difference value is compared to a plurality of battery usage ranges. Each battery usage range is associated with a bin count, a different voltage offset, and a different current offset. The bin count of one of the plurality of battery usage ranges is updated based on the comparison. The bin counts of the plurality of battery usage ranges are analyzed to determine a largest bin count and a respective battery usage range. The battery assembly is charged with a voltage offset and a current offset corresponding to the respective battery usage range with the largest bin count.

20 Claims, 8 Drawing Sheets

(51) Int. Cl.
*H01M 10/0525* (2010.01)
*H02J 7/04* (2006.01)

(52) U.S. Cl.
CPC ....... *H01M 10/443* (2013.01); *H01M 10/446* (2013.01); *H02J 7/007192* (2020.01); *H02J 7/045* (2013.01)

(58) Field of Classification Search
USPC .......................................................... 320/162
See application file for complete search history.

(56) References Cited

U.S. PATENT DOCUMENTS

| | | | | | |
|---|---|---|---|---|---|
| 7,191,077 | B2* | 3/2007 | Mese | .................... | H02J 7/0071 702/63 |
| 7,272,517 | B1* | 9/2007 | Brey | .................... | G06F 11/3409 702/60 |
| 7,928,735 | B2* | 4/2011 | Huang | .................... | G01R 31/389 324/426 |
| 8,479,024 | B2* | 7/2013 | Vichare | .................... | G06F 9/4451 713/300 |
| 8,482,248 | B2* | 7/2013 | Klicpera | .................... | H02J 7/0027 320/103 |
| 8,610,408 | B2* | 12/2013 | Nakai | .................... | H01M 10/48 320/160 |
| 8,660,809 | B2* | 2/2014 | Yu | .................... | G01R 31/367 702/63 |
| 8,769,327 | B2* | 7/2014 | Lu | .................... | H04L 12/2836 713/324 |
| 8,849,597 | B2* | 9/2014 | Viassolo | .................... | F03D 9/257 702/63 |
| 9,094,495 | B1* | 7/2015 | Robustelli | .................... | H02J 7/00047 |
| 9,166,222 | B2* | 10/2015 | Amiruddin | .................... | H01M 10/058 |
| 9,246,344 | B2* | 1/2016 | Suzuki | .................... | H01M 10/44 |
| 9,267,994 | B2* | 2/2016 | Plestid | .................... | G01R 31/3646 |
| 9,853,476 | B2* | 12/2017 | Lee | .................... | G06F 1/26 |
| 9,923,195 | B2* | 3/2018 | Amiruddin | .................... | C01G 51/50 |
| 9,997,933 | B2* | 6/2018 | Huang | .................... | H02J 7/0029 |
| 10,160,340 | B2* | 12/2018 | Lindemann | .................... | B60L 3/12 |
| 10,170,920 | B2* | 1/2019 | Robustelli | .................... | H02J 7/00047 |
| 10,230,252 | B2* | 3/2019 | Noor | .................... | H02J 7/0042 |
| 10,355,508 | B2* | 7/2019 | Lee | .................... | H02J 7/0013 |
| 10,699,278 | B2* | 6/2020 | Beaston | .................... | G06Q 30/012 |
| 10,803,268 | B2* | 10/2020 | Klicpera | .................... | G06K 7/1413 |
| 10,942,223 | B1* | 3/2021 | Malloy | .................... | H01M 50/572 |
| 2003/0015993 | A1* | 1/2003 | Misra | .................... | H02J 7/0071 320/125 |
| 2005/0134225 | A1* | 6/2005 | Mese | .................... | H02J 7/0071 320/132 |
| 2006/0244422 | A1* | 11/2006 | DiGiovanna | .................... | G06F 1/3203 320/137 |
| 2008/0185997 | A1* | 8/2008 | Fujii | .................... | H01M 10/4257 320/162 |
| 2009/0027056 | A1* | 1/2009 | Huang | .................... | G01R 31/389 324/439 |
| 2010/0138177 | A1 | 6/2010 | Yu | | |
| 2011/0239445 | A1* | 10/2011 | Ibi | .................... | H01M 50/20 29/623.1 |
| 2011/0316487 | A1* | 12/2011 | Nakai | .................... | H01M 4/485 320/160 |
| 2012/0049784 | A1* | 3/2012 | Klicpera | .................... | H02J 7/0027 320/103 |
| 2012/0053837 | A1* | 3/2012 | Viassolo | .................... | H01M 10/46 702/1 |
| 2012/0086403 | A1* | 4/2012 | Furuta | .................... | H01M 10/441 320/118 |
| 2012/0105007 | A1* | 5/2012 | Amiruddin | .................... | H01M 4/505 320/131 |
| 2012/0107680 | A1* | 5/2012 | Amiruddin | .................... | H01M 4/1393 429/206 |
| 2013/0065093 | A1* | 3/2013 | White | .................... | H01M 10/42 429/50 |
| 2013/0214730 | A1 | 8/2013 | Lu et al. | | |
| 2013/0335034 | A1* | 12/2013 | Suzuki | .................... | H01M 4/525 320/160 |
| 2016/0111900 | A1* | 4/2016 | Beaston | .................... | H02J 7/0014 320/134 |
| 2017/0047752 | A1* | 2/2017 | Robustelli | .................... | H02J 7/0021 |
| 2017/0141436 | A1* | 5/2017 | Girard | .................... | H01M 10/425 |
| 2017/0267116 | A1* | 9/2017 | Lindemann | .................... | B60L 53/14 |
| 2017/0345101 | A1* | 11/2017 | Beaston | .................... | H02J 3/32 |
| 2018/0123372 | A1* | 5/2018 | Lee | .................... | H02J 7/0013 |
| 2018/0181967 | A1* | 6/2018 | Beaston | .................... | G06Q 10/06313 |
| 2018/0198118 | A1* | 7/2018 | Amiruddin | .................... | H01M 4/587 |
| 2018/0358663 | A1* | 12/2018 | Yon Emoto | .................... | H01M 10/44 |
| 2019/0079136 | A1* | 3/2019 | Lim | .................... | G01R 31/396 |
| 2019/0178947 | A1* | 6/2019 | Robustelli | .................... | H01M 10/44 |
| 2019/0305574 | A1* | 10/2019 | Matsumura | .................... | H02J 7/0091 |
| 2019/0329346 | A1* | 10/2019 | Radtke | .................... | B23K 9/1062 |
| 2020/0125311 | A1* | 4/2020 | Nakayama | .................... | H02J 7/007192 |
| 2020/0160013 | A1* | 5/2020 | Klicpera | .................... | H02J 7/025 |
| 2020/0217896 | A1* | 7/2020 | Hatano | .................... | G01R 31/382 |
| 2020/0341073 | A1* | 10/2020 | Tang | .................... | G01R 31/3648 |
| 2020/0412137 | A1* | 12/2020 | Klicpera | .................... | G06K 7/10158 |
| 2021/0013554 | A1* | 1/2021 | Proebstle | .................... | H01M 10/425 |
| 2021/0072322 | A1* | 3/2021 | Makam | .................... | H02J 7/0021 |

* cited by examiner

DOD HISTORY

| INSERTION CYCLE | ACTUAL DOD | BIN TYPE | BIN WEIGHT FACTOR |
|---|---|---|---|
| 1 | 1% | 1 | 0.5 |
| 2 | 2% | 1 | 0.5 |
| 3 | 1% | 1 | 0.5 |
| 4 | 13% | 4 | 2 |
| 5 | 4% | 2 | 0.75 |
| 6 | 2% | 1 | 0.5 |
| 7 | 3% | 2 | 0.75 |
| 8 | 1% | 1 | 0.5 |
| 9 | 0% | 1 | 0.5 |
| 10 | 0% | 1 | 0.5 |
| 11 | 1% | 1 | 0.5 |
| 12 | 25% | 4 | 2 |
| 13 | 34% | 4 | 2 |
| 14 | 2% | 1 | 0.5 |
| 15 | 75% | 5 | 5 |
| 16 | 2% | 1 | 0.5 |
| 17 | 3% | 2 | 0.75 |
| 18 | 1% | 1 | 0.5 |
| 19 | 1% | 1 | 0.5 |
| 20 | 2% | 1 | 0.5 |

FIG. 2A

METHODS AND SYSTEM FOR DYNAMICALLY MODIFYING CHARGING SETTINGS FOR A BATTERY ASSEMBLY

BACKGROUND OF THE INVENTION

Lithium ion batteries, lithium ion super capacitors, and electrical double layer capacitor (ELDC) super capacitors have risen to prominence as the manufacturer's choice in consumer electronics. However, the viability of these devices, or indeed any battery, is dependent on the various forces governing their operation.

For example, batteries deteriorate more rapidly when they are operated at higher temperatures, particularly when charged to a higher voltage. To make matters worse, charging batteries at a high input current facilitates self-heating of the battery. To combat these forces, a battery may be charged to a lower voltage or charged at a lower current level. Either of these solutions produces a longer service life of the battery by mitigating the effects of internal forces generated by higher voltages and charging currents.

On the other hand, should a consumer desire a longer runtime for their device, these solutions may not be ideal. Charging the battery to a lower voltage will cause the battery to deplete its charge reserve faster, and using a smaller charging current will reduce the number of times the consumer can use their device in a short time span.

Nonetheless, products are typically optimized for either long runtime or long service life by the manufacturer without the ability of the consumer to change it afterwards. Accordingly, there is a need for a way to modify charging settings for a battery based on the particular needs of a consumer.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIG. 2A illustrates a first portion of an example usage history analysis, in accordance with various embodiments of the present invention.

Figure 1A:
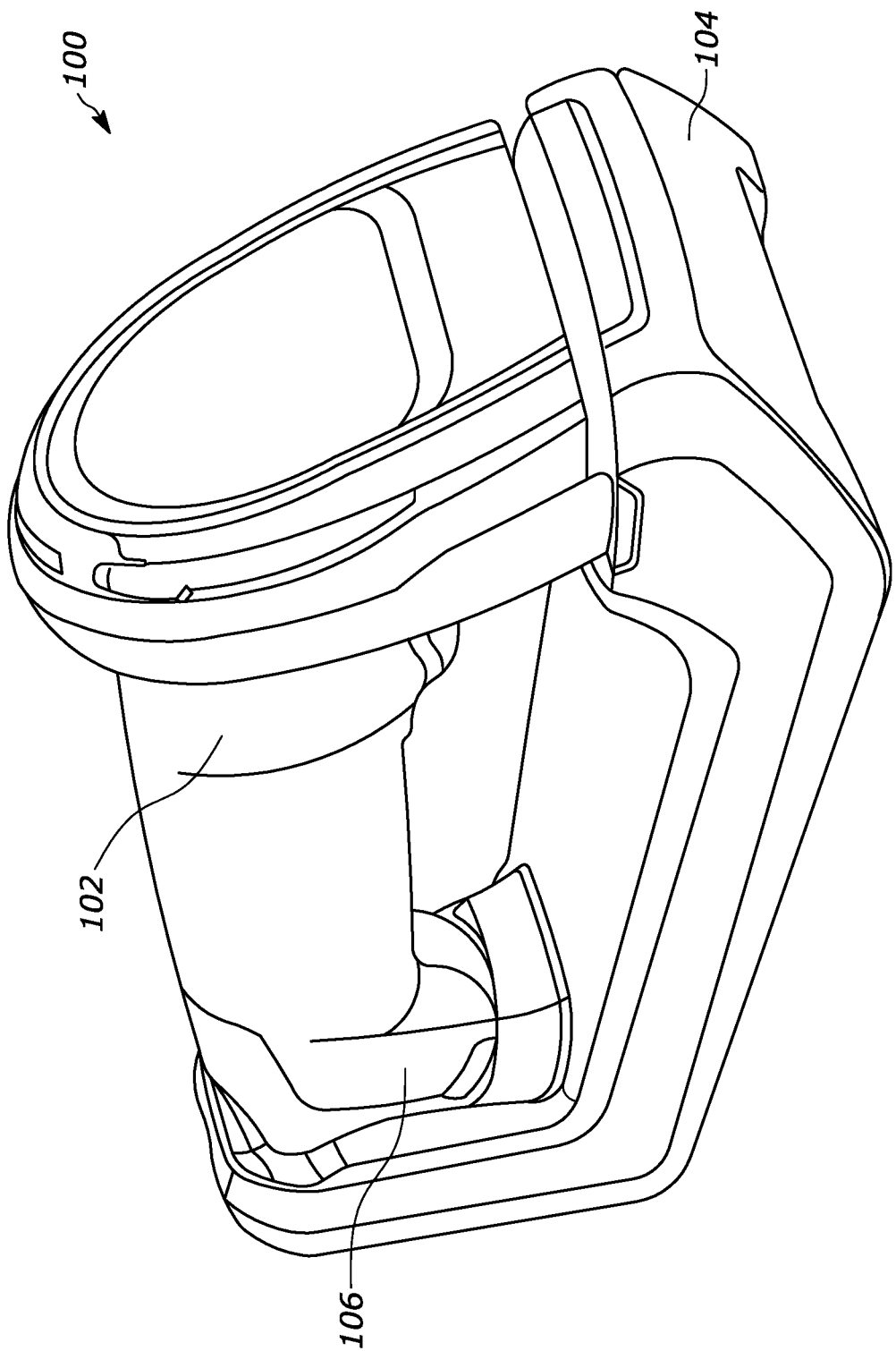
FIG. 1A is a perspective view of a scanning device and charging station, in accordance with various embodiments of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Although the following text sets forth a detailed description of numerous different embodiments, it should be understood that the legal scope of the description is defined by the words of the claims set forth at the end of this patent and equivalents. The detailed description is to be construed as exemplary only and does not describe every possible embodiment since describing every possible embodiment would be impractical. Numerous alternative embodiments could be implemented, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning.

In one embodiment, a method for dynamically modifying charging settings for a battery assembly may be provided. The method may comprise receiving a first usage value for the battery assembly associated with a beginning time point of usage cycle; receiving a second usage value for the battery assembly associated with an ending time point of the usage cycle; determining a usage difference value for the battery assembly by comparing the first usage value to the second usage value; comparing the usage difference value to a plurality of battery usage ranges, each of the battery usage ranges being associated with a bin count and each of the battery usage ranges being associated with a different voltage offset and current offset; updating the bin count of one of the plurality of battery usage ranges based on the comparison; analyzing the bin counts of the plurality of battery usage ranges to determine a largest bin count and a respective battery usage range; and/or prior to a next usage cycle of the battery assembly, charging the battery assembly with a voltage offset and a current offset corresponding to the respective battery usage range with the largest bin count.

In another embodiment, a method for dynamically modifying charging settings for a battery assembly may be provided. The method may comprise receiving a first battery charge status value associated with a first time point during a usage cycle of the battery assembly; receiving a second battery charge status value associated with a second time point during the usage cycle; determining a depth of battery discharge between the first time point and the second time point by comparing the first battery charge status value to the second battery charge status value; comparing the depth of battery discharge to a plurality of depth of discharge ranges, each of the plurality of depth of discharge ranges being associated with a bin count and each of the plurality of depth of discharge ranges being associated with a different voltage offset and current offset; updating the bin count of one of the plurality of depth of discharge ranges based on the comparison; analyzing the bin counts of the plurality of depth of discharge ranges to determine a largest bin count and respective depth of discharge range; and/or prior to a next usage cycle of the battery assembly, charging the battery assembly with a voltage offset and a current offset corresponding to the respective depth of discharge range with the largest bin count.

In another embodiment, a system for dynamically modifying charging settings may be provided. The system may comprise a charging station and a scanning device comprising a battery assembly, configured to be communicatively coupled with the scanning device. The scanning device may be further configured to receive a first usage value for the battery assembly associated with a beginning time point of usage cycle; receive a second usage value for the battery assembly associated with an ending time point of the usage cycle; determine a usage difference value for the battery assembly by comparing the first usage value to the second usage value; compare the usage difference value to a plurality of battery usage ranges, each of the battery usage ranges being associated with a bin count and each of the battery usage ranges being associated with a different voltage offset and current offset; update the bin count of one of the plurality of battery usage ranges based on the comparison; analyze the bin counts of the plurality of battery usage ranges to determine a largest bin count and a respective battery usage range; and/or prior to a next usage cycle of the battery assembly, transmit a charging signal to the charging station to cause the charging station to charge the battery assembly with a voltage offset and a current offset corresponding to the respective battery usage range with the largest bin count.

In another embodiment, a method for dynamically identifying spare batteries may be provided. The method may comprise accessing one or more respective battery charge settings for each respective battery of a plurality of batteries and a respective battery charge history for each of the respective batteries of the plurality of batteries; analyzing, for each respective battery of the plurality of batteries, the one or more respective battery charge settings and the respective battery charge history to identify at least one spare battery from the plurality of batteries; and adjusting the one or more respective battery charge settings of the at least one spare battery.

In another embodiment, a system for dynamically identifying spare batteries may be provided. The system may comprise a plurality of batteries each including (i) one or more respective battery charge settings and (ii) a respective battery charge history; and a spare battery designation module. The spare battery designation module may be configured to access both the one or more respective battery charge settings and the respective battery charge history; analyze both the one or more respective battery charge settings and the respective battery charge history to identify at least one spare battery from the plurality of batteries; and adjust the one or more respective battery charge settings of the at least one spare battery.

In another embodiment, a system for dynamically updating battery charge settings may be provided. The system may comprise a plurality of batteries each including (i) one or more respective battery charge settings and (ii) a respective battery charge history; and a battery analysis module. The battery analysis module may be configured to access both the one or more respective battery charge settings and the respective battery charge history; receive a first indicator from the respective battery charge history; receive a second indicator from the respective battery charge history; determine a difference indicator by comparing the first indicator to the second indicator; compare the difference indicator to a plurality of indicator ranges; update an indicator range of the plurality of indicator ranges by placing the difference indicator in the indicator range; analyze the plurality of indicator ranges to determine a largest total number of difference indicators in a respective indicator range; identify at least one spare battery from the plurality of batteries based on the analysis; and adjust a set of battery charge settings corresponding to the at least one spare battery based on the respective indicator range with the largest total number of difference indicators.

In various embodiments of the present disclosure, methods and a related system are described for dynamically modifying charging settings for a battery assembly. The methods and related system provide solutions where, e.g., scanning devices that allow for consumer adjustment of battery charging settings require manual adjustment by the consumer.

In various embodiments of the present disclosure, systems and related methods are described for dynamically identifying spare batteries in a battery assembly. The systems and related methods provide solutions where, e.g., devices that typically operate with multiple batteries require manual designation of spare batteries and do not change charging settings for the spare batteries based on such manual designation.

Manual adjustment of battery charging settings may result in harm to the battery if the consumer is unaware of the impacts various charging settings have on the battery. For example, consumers may opt for a higher charging voltage or current to more quickly achieve a fully charged battery without understanding that this aggressive charging strategy will likely reduce the effective service life of the battery. Moreover, many consumers simply do not want to either manually change or habitually manage a battery charging setting.

Thus, the disclosure of the present application resolves such issues by providing methods and a related system to dynamically modify the charging settings for a battery assembly based on the usage history of a device containing the battery assembly. In this way, the disclosure of the present application removes the uncertainty surrounding the impact of battery charging settings and alleviates the tedium of adjusting battery charging settings. The methods and related systems disclosed herein automatically update the battery charging characteristics associated with a particular battery assembly to tailor the charging profile to the particular needs of an individual consumer based on the consumer's historical usage of the device.

Moreover, the disclosure of the present application resolves similar issues as applied to spare batteries by dynamically identifying spare batteries of a battery assembly and changing the charging settings of the identified spare battery accordingly. In this way, the disclosure of the present application eliminates confusion surrounding spare battery designation, and improves spare battery service life. Thus, the method and related systems optimally configure spare battery charge settings to avoid battery degradation, resulting in increased spare battery performance, device uptime, and consumer satisfaction.

Referring now to the drawings, FIG. 1A is a perspective view 100 of a scanning device 102 (additionally referenced herein as a "terminal") and charging station 104, in accordance with various embodiments of the present invention. Scanning device 102 includes a battery assembly 106. In various embodiments, the battery assembly 106 may include one or more of (i) lithium ion batteries, (ii) lithium ion super capacitors, and (iii) electrical double layer capacitor super capacitors. It should be understood that scanning device 102 may include devices that do not possess scanning functionality (e.g., imaging devices).

Scanning device 102 is configured to decouple (not shown) from the charging station 104 for the purpose of, for example, capturing 1D or 2D images (e.g., barcodes). The charging station 104 is configured to charge the battery assembly 106 while the scanning device 102 is coupled to the charging station 104. Alternatively, the charging station 104 may be integrated, wholly or in-part, into the scanning device 102 so that the scanning device 102 may not decouple from the charging station 104. For example, the charging station 104 may be a cable running from a power supply to the scanning device 102, or a standalone power supply wholly integrated into the scanning device 102.

As described further herein, the scanning device 102 may be configured to receive a first usage value for the battery assembly 106 associated with a beginning time point of a usage cycle. Scanning device 102 may also be configured to receive a second usage value for the battery assembly 106 associated with an ending time point of the usage cycle. In various embodiments, the beginning time point may be associated with decoupling the scanning device 102 from the charging station 104. In those embodiments, the ending time point may be associated with coupling the scanning device 102 with the charging station 104.

The battery assembly 106 may also be a removable battery assembly such that one or more distinct batteries may be used to power the scanning device 102. To illustrate, and as discussed further herein, the scanning device 102 may have need to operate beyond the battery life of a primary battery in the battery assembly 106. In this instance, the removable battery assembly may decouple from the scanning device 102 and receive a spare battery to replace the primary battery.

Figure 1B:
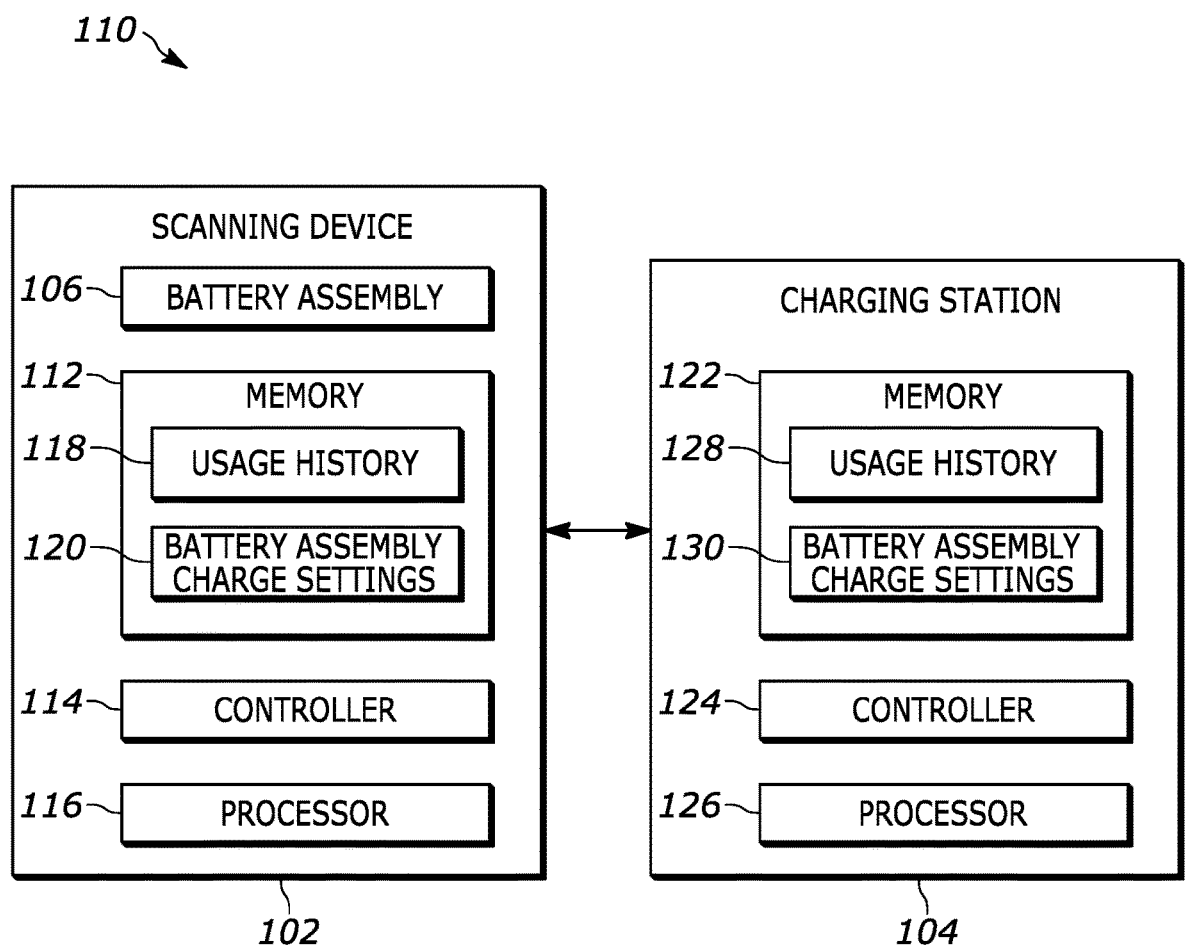
FIG. 1B illustrates an example system, in accordance with various embodiments of the present invention.

As illustrated in FIG. 1B, an example system 110 includes the scanning device 102 and the charging station 104. The scanning device 102 includes the battery assembly 106, a memory 112, a controller 114, and a processor 116. The memory 112 includes a usage history 118 and battery assembly charge settings 120. In certain embodiments, the charging station 104 includes a memory 122, a controller 124, and a processor 126. Further in these embodiments, the memory 122 includes a usage history 128 and battery assembly charge settings 130. Moreover, while referred to herein as a single "memory," a single "controller," and/or a single "processor," in some embodiments memory (112, 122), controller (114, 124), and/or processor (116, 126), includes two or more memories, two or more controllers, and/or two or more processors.

In this example system 110, the controller 114 may receive the first and second usage values and store those values in the usage history 118. Moreover, the processor 116 may determine a usage difference value for the battery assembly 106 by comparing the first usage value to the second usage value. The processor 116 may further compare the usage difference value to a plurality of battery usage ranges, which are stored in the usage history 118. The processor 116 may then update the bin count of one of the plurality of battery usage ranges stored in the usage history 118 based on the comparison, and analyze the bin counts of a plurality of battery usage ranges to determine a largest bin count and a respective battery usage range. The controller 114 may then transmit a charging signal to the charging station 104 to cause the charging station 104 to charge the battery assembly 106 with a voltage offset and a current offset. The processor 116 may generate the charging signal by, for example, accessing the battery assembly charge settings 120 to retrieve the desired voltage and current offsets corresponding to respective battery usage range with the largest bin count.

However, it should be understood that the beginning time point and the ending time point may be associated with any two points in time wherein the scanning device 102 is in use. For example, in other embodiments, the beginning time point may be associated with an activation of the scanning device 102 to capture 1D or 2D images (e.g., barcodes), and the ending time point may be associated with any other point in time subsequent to the beginning time point. In these embodiments, the scanning device 102 may be equipped with a transmitter, transceiver, or other suitable device to transmit the relevant points in time to the charging station 104 or other external device configured to receive the beginning and end time points for the purposes described further herein.

To illustrate these embodiments, the beginning time point may be associated with an activation of the scanning device 102 to capture 1D or 2D images. The ending time point may be associated with any subsequent activation of the scanning device 102, a predetermined number of activations of the scanning device 102 subsequent to the first activation of the scanning device 102, a predetermined amount of time after the first activation of the scanning device 102, or a predetermined amount of time after any subsequent activation of the scanning device 102.

Figure 1C:
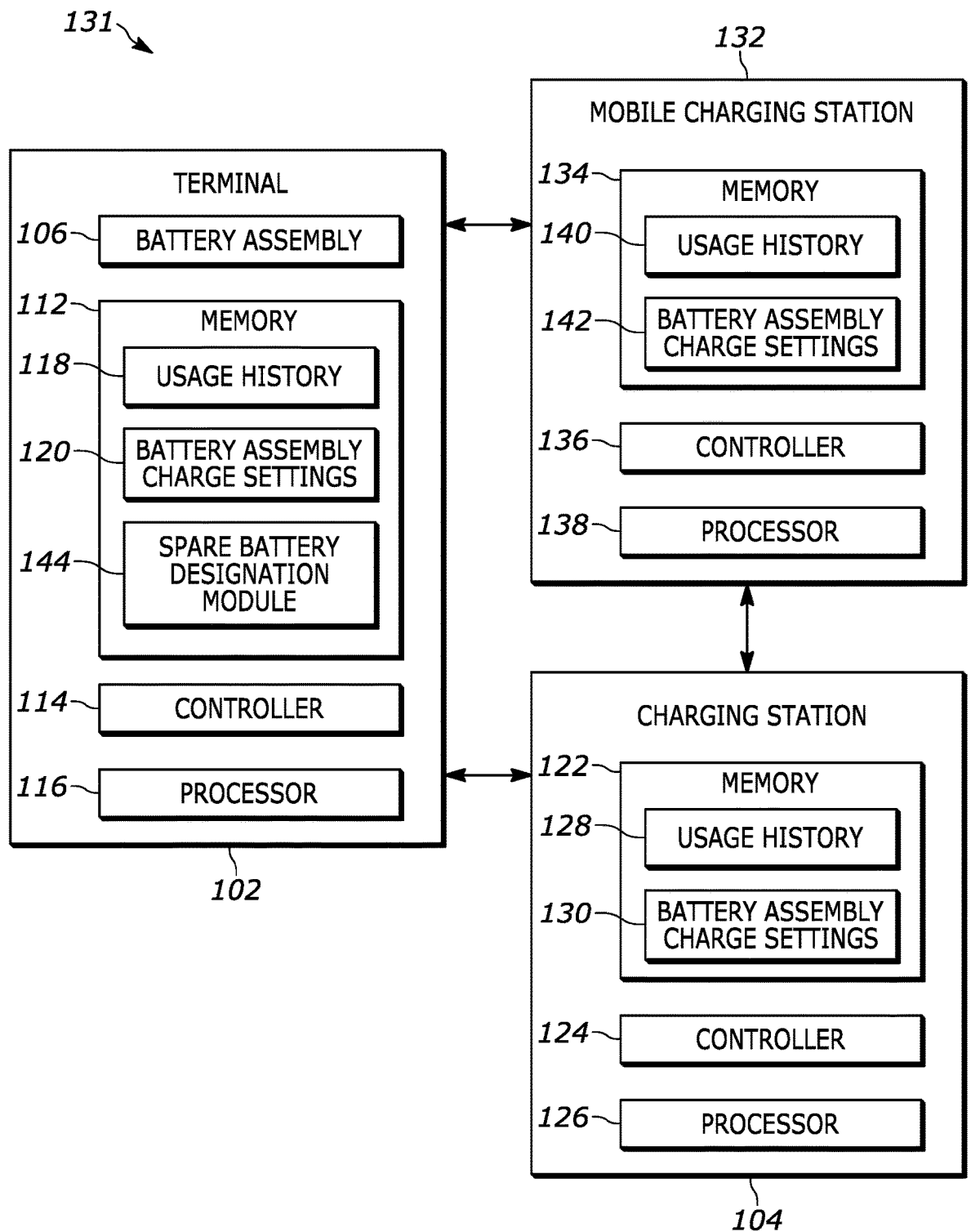
FIG. 1C illustrates another example system, in accordance with various embodiments of the present invention.

Additionally, and in reference to FIG. 1C, an example system 131 of the present application includes multiple charging stations (e.g., charging station 104 and mobile charging station 132). The mobile charging station 132 includes a memory 134, controller 136, and a processor 138. The memory 134 includes a usage history 140 and battery assembly charge settings 142. Each of the terminal 102, charging station 104, and the mobile charging station 132 are communicatively coupled to one another, and may share information (e.g., battery assembly charge information) to create an accurate representation of charge settings for any particular battery utilized in the example system 131, regardless of the battery's current location within the system.

For example, and in some embodiments, the battery assembly 106 may be removable to include a plurality of batteries, and the terminal 102 may draw power from a single battery (e.g., a primary battery). Once the primary battery is drained of its charge, the terminal 102 will cease to operate unless a replacement battery (e.g., a spare battery) is placed in the battery assembly 106. The spare battery may be located in the mobile charging station 132 prior to being inserted into the terminal 102. However, after the spare battery is removed from the terminal 102, the spare battery may be placed in the charging station 104 to replenish its charge. Thus, the mobile charging station 132 may transfer charge settings related to the spare battery from its battery assembly charge settings 142 to the battery assembly charge settings 130 of the charging station 104 to facilitate charging the spare battery according to the appropriate charge settings.

Similarly, when updating the charge settings for the spare battery, as discussed further herein, the terminal 102, mobile charging station 132, and the charging station 104 may transfer their respective usage histories (118, 128, 140) associated with the spare battery to develop accurate usage patterns for the spare battery.

To enable spare battery designations and corresponding charge setting changes, the terminal 102 also includes a spare battery designation module 144. As discussed further herein, the spare battery designation module 144 may be configured to access both the battery assembly charge settings (120, 130, 142) and usage histories (118, 128, 140) to analyze the charge settings and usage histories for each battery included in the plurality of batteries. The spare battery designation module 144 may then identify a spare battery based on the analysis, and adjust the charge settings of the identified spare battery. The spare battery designation module 144 may adjust the charge settings of the spare battery by, for example, transmitting updated spare battery charge settings to each of the battery assembly charge settings (120, 130, 142) for storage in each respective memory (112, 122, 134).

The spare battery designation module 144 is shown in the terminal 102, but it should be understood that the spare battery designation module 144 may be located in the mobile charging station 132, the charging station 104, the battery assembly 106, and/or each of the respective batteries of the plurality of batteries. In some embodiments, both the battery assembly charge settings and usage histories for each respective battery in the plurality of batteries are located in each respective battery of the plurality of batteries. Thus, in these embodiments, the spare battery designation module 144 may access the battery assembly charge settings and usage histories for each respective battery through each respective battery of the plurality of batteries.

Figure 2B:
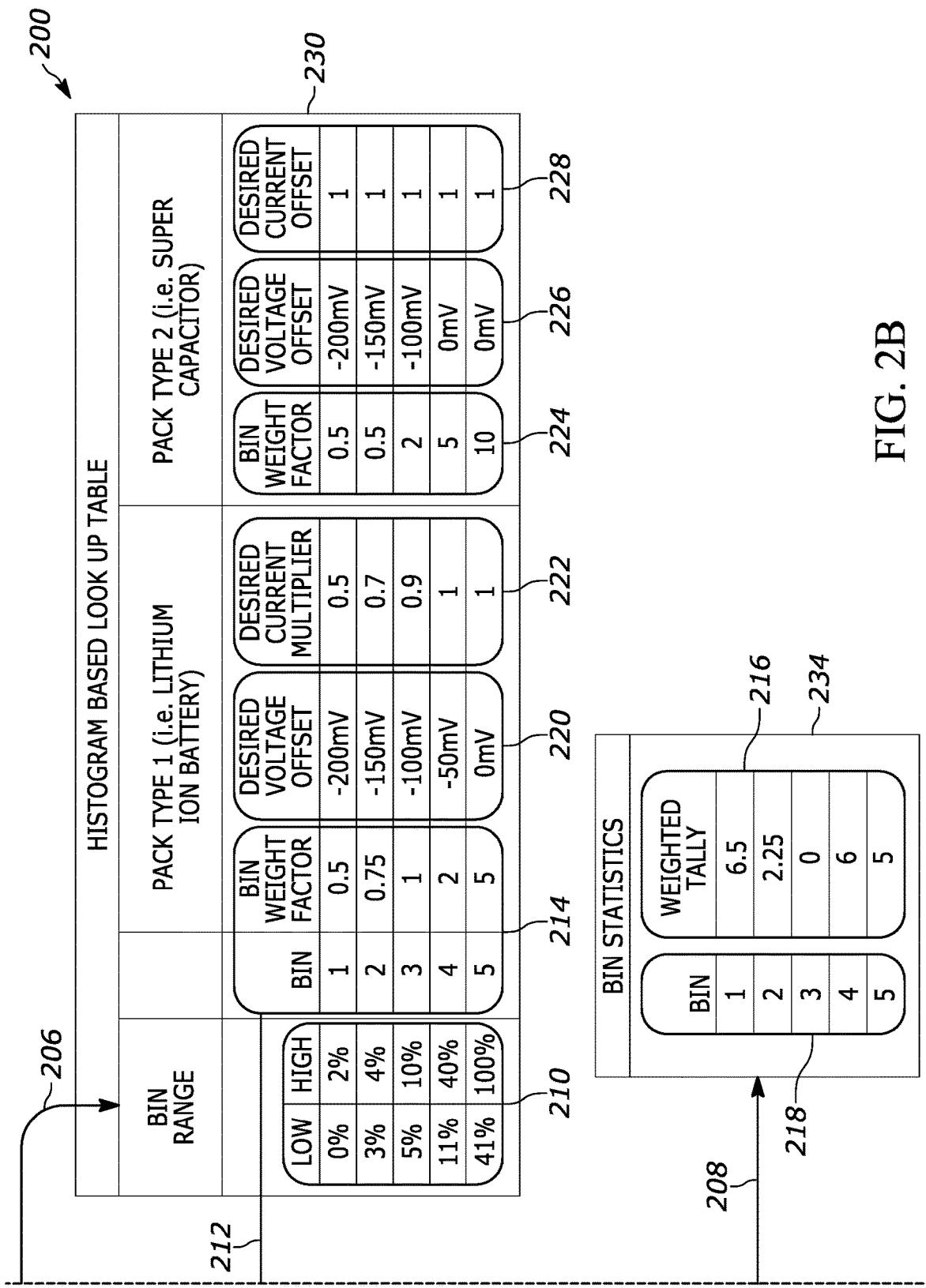
FIG. 2B illustrates a second portion of an example usage history analysis, in accordance with various embodiments of the present invention.

To illustrate an example analysis performed by the systems of the present disclosure, and in reference to FIGS. 2A and 2B, an example usage history analysis 200 is presented. Example usage history analysis 200 includes a histogram based look up table 230, a battery usage value history table 232 (illustrated herein as a depth of discharge (DOD) history table), and a bin statistics table 234. Each of the histogram based look up table 230, battery usage value history table 232, and bin statistics table 234 contain one or more subcategories (e.g., usage values 202 and usage bin values 204 corresponding to the battery usage value history table 232) containing one or more values associated with their respective subcategories. However, it should be understood that each table may contain more or less subcategories than illustrated, and each subcategory may contain more or less values than illustrated.

The histogram based look up table 230 may include bin range delineations 210, type 1 bin factors 214, type 1 desired voltage offsets 220, type 1 desired current multipliers 222, type 2 bin factors 224, type 2 desired voltage offsets 226, and type 2 desired current offsets 228. The bin range delineations 210 may contain low and high range values corresponding to the various ranges of battery usage values associated with a particular bin. The type 1 bin factors 214 and type 2 bin factors 224 contain weighting factors associated with a respective bin number. The type 1 desired voltage offsets 220 and type 2 desired voltage offsets 226 contain the voltage offset values associated with a respective bin number. The type 1 desired current multipliers 222 and type 2 desired current offsets 228 contain the current multipliers associated with a respective bin number. The histogram based look up table 230 may be stored in a memory (e.g., memory 112, 122, 134).

For example, as illustrated and as further described herein, if the depth of discharge for a particular insertion cycle of a device (e.g., scanning device 102) is 3.5%, then the bin number associated with the particular insertion cycle will be bin number 2. To further this example, based on the type of battery apparatus under consideration (i.e., type 1 or type 2), the particular insertion cycle will then have a weighting factor of either 0.75 (type 1) or 0.5 (type 2) based on the bin number. Finally, the desired voltage offset and current multiplier will be associated with the particular insertion cycle. In this example, the voltage offset would be −150 mV for both type 1 and 2 battery apparatus, and the current multipliers would be 0.7 (type 1) and 1 (type 2). Moreover, the analysis illustrated in this example may be performed by a processor (e.g., processor 116, 126, 138).

The battery usage value history table 232 may include usage values 202 and usage bin values 204. The usage values 202 may contain information corresponding to the historical usage of a device (e.g., insertion cycles and actual DOD of, for example, the scanning device 102). The usage bin values 204 may contain information corresponding to the weighting factors and their respective bin numbers. The battery usage value history table 232 may be stored in a memory (e.g., memory 112, 122, 134).

For example, and as further discussed herein, for each insertion cycle and actual DOD listed in the usage values 202, a processor (e.g., processor 116, 126, 138) may reference (illustrated by 206 and 212) the histogram based look up table 230 (e.g., type 1 bin factors 214 and type 2 bin factors 224) to determine a corresponding bin number and weighting factor. The processor may then populate the usage bin values 204 of the battery usage value history table 232 with the corresponding bin number and weighting factor.

To illustrate, for insertion cycle 4 as listed in the usage values 202, the processor may reference the histogram based look up table 230 to determine the corresponding bin number of 4 and weighting factor of 2. The processor may then populate the usage bin values 204 with the bin number and weighting factor corresponding to insertion cycle 4.

The bin statistics table 234 may include bin values 218 and weighted tallies 216. The bin values 218 may contain information corresponding to the bin numbers. The weighted tallies 216 may contain information corresponding to the weighted summation of bin numbers. The bin statistics table 234 may be stored in a memory (e.g., memory 112, 122, 134).

To illustrate, and as further discussed herein, the processor (e.g., processor 116, 126, 138) may obtain (illustrated by 208) the bin numbers and corresponding weighting factors from the battery usage value history table 232 (e.g., the usage bin values 204). The processor may then populate the bin values 218 with the bin numbers, and multiply the total number of instances of each respective bin number included in the usage bin values 204 by the corresponding weighting factor associated with the respective bin number to generate weighted values. The processor may then populate the weighted values into the weighted tallies 216.

For example, in FIG. 2, the processor (e.g., processor 116, 126, 138) may obtain the bin numbers (i.e., 1-5) from the battery usage value history table 232 to populate the bin values 218. The processor may also obtain the corresponding weighting factors (i.e., 0.5, 0.75, 1, 2, and 5 for type 1 battery assemblies) from the battery usage value history table 232. The processor may then multiply the total number of instances of each respective bin number (e.g., 13 instances of bin number 1, 3 instances of bin number 2, 0 instances of bin number 3, 3 instances of bin number 4, and 1 instance of bin number 5) with their corresponding weighting factors to achieve the values of the weighted tallies 216 (e.g., 6.5 for bin number 1, 2.25 for bin number 2, 0 for bin number 3, 6 for bin number 4, and 5 for bin number 5).

Figure 3:
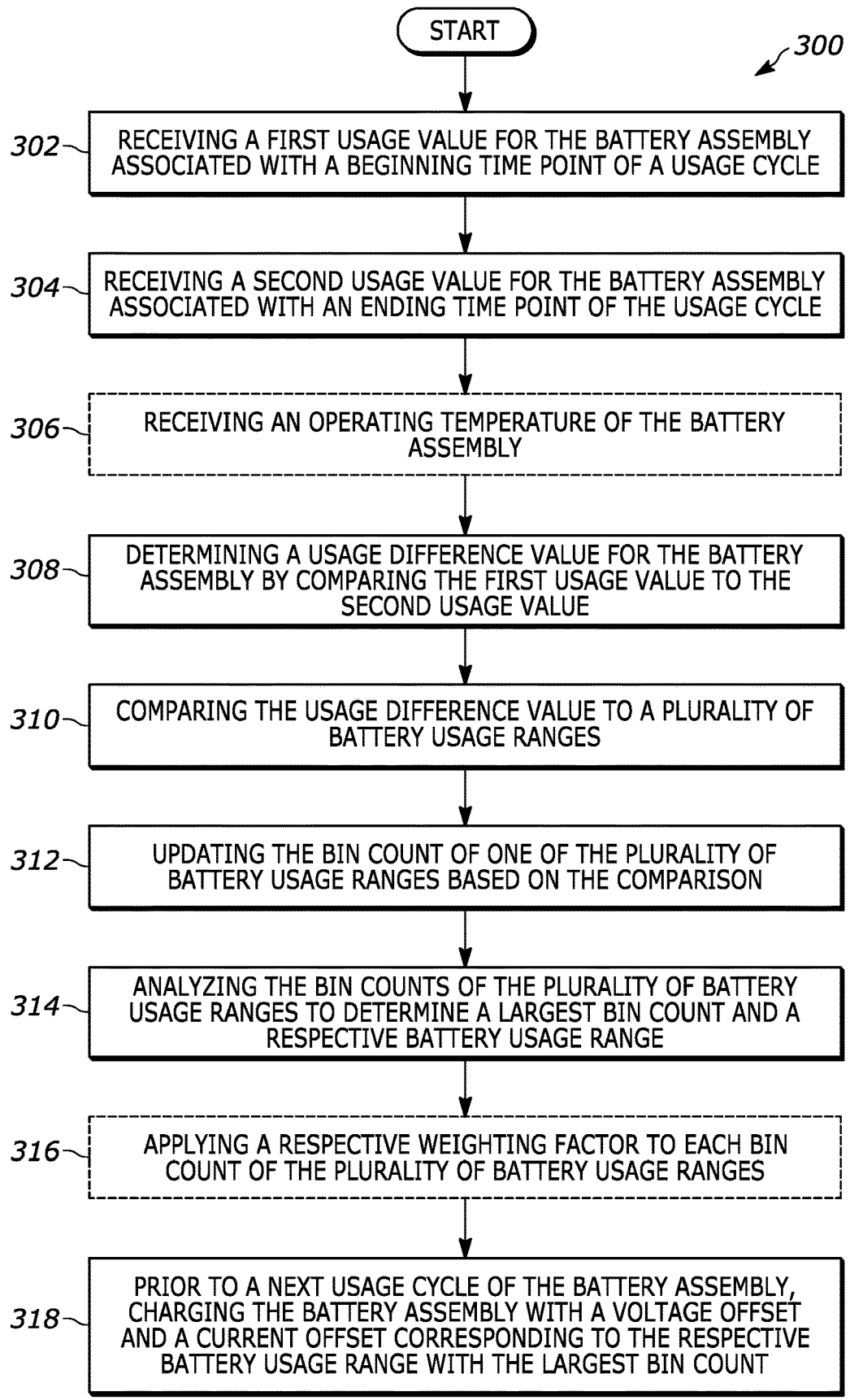
FIG. 3 illustrates an example method for dynamically modifying charging settings for a battery assembly, in accordance with various embodiments of the present invention.

FIG. 3 illustrates an example method for dynamically modifying charging settings for a battery assembly, in accordance with various embodiments of the present invention. The method 300 begins at block 302, where, for example, a scanning device (e.g., scanning device 102) receives a first usage value for the battery assembly (e.g., battery assembly 106) associated with a beginning time point of a usage cycle.

At block 304, the method 300 includes receiving a second usage value for the battery assembly 106 associated with an ending time point of the usage cycle. The usage cycle may be defined by the beginning time point and the end time point. As previously mentioned, the beginning time point and ending time point may have various values associated with, for example, activations of the device, coupling/decoupling of the device from a charging station, or any other suitable metric. Block 304 may be performed by, for example, the controller 114 of the scanning device 102.

In embodiments where the usage cycle corresponds to coupling/decoupling of the device from the charging station, the usage cycle is associated with an insertion cycle. For example, the scanning device 102 may be configured to receive the first and second usage values corresponding to the coupling/decoupling of the scanning device 102 from the charging station 104. In this way, the coupling/decoupling of the scanning device 102 from the charging station 104 corresponds to an insertion cycle where the scanning device 102 is initially detached from the charging station 104, and subsequently inserted back into the charging station 104 after use. These insertion cycles may, for example, populate a table (e.g., battery usage value history table 232) or otherwise be stored in memory for the scanning device 102 or other suitable device to perform the remaining steps of the method 300.

In various embodiments, the first usage value may be a first battery charge status value and the second usage value may be a second battery charge status value. In other embodiments, the first usage value may be at least one of (i) a first time and (ii) a first number of scans, and the second usage value may be at least one of (i) a second time and (ii) a second number of scans.

At optional block 306, the method 300 includes receiving an operating temperature of the battery assembly. The operating temperature of the battery assembly may be determined by, for example, a temperature sensor included in a device (e.g., the scanning device 102) or an external temperature sensor configured to communicate with a charging station (e.g., charging station 104) or other communications receiving device. Optional block 306 may be performed by, for example, the controller 114 of the scanning device 102.

At block 308, the method 300 includes determining a usage difference value for the battery assembly by comparing the first usage value to the second usage value. For example, if the first usage value is a first battery charge status value and the second usage value is a second battery charge status value, then in various embodiments, the usage difference value may be a depth of battery discharge. In other embodiments, when the first usage value may be at least one of (i) a first time and (ii) a first number of scans, and the second usage value may be at least one of (i) a second time and (ii) a second number of scans, the usage difference value may be at least one of (i) a time between charges and (ii) a scan number difference. Block 308 may be performed by, for example, the processor 116 of the scanning device 102.

In embodiments where the usage difference value may be at least one of a time between charges or a scan number difference, the usage difference value may be a time between charges. In that case, the scanning device 102 may determine the usage difference value by subtracting the first time from the second time.

To illustrate, the scanning device 102, or other suitable device, may receive a first time of 2:00 PM and a second time of 3:00 PM. The scanning device 102 may subtract the first time from the second time to determine a time between charges of 1 hour. The scanning device 102 or other suitable device may, for example, store the 1 hour time between charges in a table (e.g., battery usage value history table 232) or otherwise store the 1 hour time between charges in memory (e.g., memory 112) for the scanning device 102 or other suitable device to perform the remaining steps of the method 300.

In other embodiments where the usage difference value may be at least one of a time between charges or a scan number difference, the usage difference value may be a scan number difference. In that case, the scanning device 102 may determine the usage difference value by subtracting the first number of scans from the second number of scans.

To illustrate, the scanning device 102, or other suitable device, may receive a first number of scans of 50 and a second number of scans of 73. The scanning device 102 may subtract the first number of scans from the second number of scans to determine a scan number difference of 23. The scanning device 102 or other suitable device may, for example, store the scan number difference of 23 in a table (e.g., battery usage value history table 232) or otherwise store the scan number difference of 23 in memory (e.g., memory 112) for the scanning device 102 or other suitable device to perform the remaining steps of the method 300.

It should be understood that the first number of scans may correspond to a total number of scans of a device (e.g., scanning device 102) over the lifetime of the device prior to the usage cycle of interest, or a total number of scans of the scanning device 102 over any suitable range. For example, the first number of scans may correspond to a total number of scans for the charging device 102 in a particular day, month, year, or any other suitable time period prior to the usage cycle of interest.

Similarly, the second number of scans may correspond to a total number of scans of a device (e.g., scanning device 102) over the lifetime of the device after the usage cycle of interest, or a total number of scans of the scanning device 102 over any suitable range. For example, the second number of scans may correspond to a total number of scans for the charging device 102 in a particular day, month, year, or any other suitable time period after the usage cycle of interest.

At block 310, the method 300 includes comparing the usage difference value to a plurality of battery usage ranges. In various embodiments, the plurality of battery usage ranges may be a plurality of depth of battery discharge ranges. In other embodiments, the plurality of battery usage ranges may be at least one of (i) a plurality of time between charges ranges and (ii) a plurality of scan number difference ranges. Block 310 may be performed by, for example, the processor 116 of the scanning device 102. The plurality of battery usage ranges may be included in, for example, the usage history 118.

At block 312, the method 300 includes updating the bin count of one of the plurality of battery usage ranges based on the comparison. Block 312 may be performed by, for example, the processor 116 of the scanning device 102. Moreover, the bin counts for one and/or more of the plurality of battery usage ranges may be included in, for example, the usage history 118.

In embodiments where the plurality of battery usage ranges is a plurality of time between charges ranges, each of the plurality of time between charges ranges may have a range of values included therein. For example, each of the plurality of time between charges ranges may include a first range from 0 minutes to 60 minutes and a second range from 61 minutes to 180 minutes, or any other suitable number and/or division of ranges.

To illustrate, if the plurality of battery usage ranges is a plurality of time between charges ranges, the time between charges may be, for example, 35 minutes. The scanning device 102 may update the bin count of the particular time between charges range which includes 35 minutes. Referring to the above example, the scanning device 102 may update the bin count of the first range because 35 minutes is included in the range of 0 minutes to 60 minutes. Moreover, the scanning device 102 may be configured to update the bin count of a bin by 1 for any respective usage difference value, or by any suitable amount.

In other embodiments where the plurality of battery usage ranges is a plurality of scan number difference ranges, each of the plurality of scan number difference ranges may have a range of values included therein. For example, each of the plurality of scan number difference ranges may include a first range from 0 scans to 10 scans and a second range from 11 scans to 40 scans, or any other suitable number and/or division of ranges.

To illustrate, if the plurality of battery usage ranges is a plurality of scan number difference ranges, the scan number difference may be, for example, 21 scans. The scanning device 102 may update the bin count of the particular scan number difference range which includes 21 scans. Referring to the above example, the scanning device 102 may update the bin count of the second range because 21 scans is included in the range of 11 scans to 40 scans. Moreover, the scanning device 102 may be configured to update the bin count of a bin by 1 for any respective usage difference value, or by any suitable amount.

At block 314, the method 300 includes analyzing the bin counts of the plurality of battery usage ranges to determine a largest bin count and a respective battery usage range. In various embodiments, the largest bin count may be a largest number of insertion cycles. In certain embodiments, the respective battery usage range may be a respective depth of battery discharge range. In yet other embodiments, the respective battery usage range may be at least one of (i) a respective time between charges range and (ii) a respective scan number difference range. Block 314 may be performed by, for example, the processor 116 of the scanning device 102.

At optional block 316, the method 300 includes applying a respective weighting factor to each bin count of the plurality of battery usage ranges. In this block, the largest bin count corresponds to a largest weighted bin count. Optional block 316 may be performed by, for example, the processor 116 of the scanning device 102.

Generally, the respective weighting factors indicate the importance of a particular battery usage range with respect to the charging characteristics of the battery assembly. For example, and with reference to FIG. 2, bin number 1 has a respective weighting factor of 0.5 and bin number 5 has a respective weighting factor of 5. Bin number 1 includes, for example and in the context of FIG. 2, depth of discharge ranges indicative of short usage cycles of a device (e.g., charging device 102). Hence, the particular amount of charge remaining in the battery assembly 106 and the rate at which the battery assembly 106 is charged after such use is deemphasized because the battery assembly 106 has not been drained to a point that may impact a subsequent use. However, a usage range falling in bin number 5 is indicative of a substantial use of the scanning device 102. Thus, the battery assembly 106 may necessitate a higher level of final charge and/or a faster charging rate to accommodate the potential for a similar subsequent use of the scanning device 102 without the battery assembly 106 running out of charge.

At block 318, the method 300 includes prior to a next usage cycle of the battery assembly 106, charging the battery assembly 106 with a voltage offset and a current offset corresponding to the respective battery usage range with the largest bin count. Block 318 may be performed by, for example, the charging station 104.

In various embodiments, charging the battery assembly 106 with the voltage offset and the current offset may further comprise determining that the respective battery usage range is different from a prior respective battery usage range. Determining that the respective battery usage range is different from a prior respective battery usage range may be performed by, for example, the processor 116 of the scanning device 102. For example, and with reference to FIG. 2, the scanning device 102 may analyze the bin counts of each of the plurality of battery usage ranges and determine that bin number 1 has the largest bin count. Thus, the scanning device 102 may further determine whether the voltage and current offsets associated with the battery usage range corresponding to bin number 1 were the voltage and current offsets applied to charge the battery assembly 106 prior to the current usage cycle.

In these embodiments, charging the battery assembly 106 with the voltage offset and the current offset may additionally further comprise at least one of: decreasing a charging voltage if (i) the respective battery usage range is below a prior respective battery usage range or (ii) the operating temperature of the battery assembly is above a threshold value; decreasing a charging current if (i) the respective battery usage range is below the prior respective battery usage range or (ii) the operating temperature of the battery assembly 106 is above the threshold value; increasing the charging voltage if the respective battery usage range is above a prior respective battery usage range; and increasing the charging current if the respective battery usage range is above the prior respective battery usage range.

In other words, based on the determination whether the voltage and current offsets used to charge the battery assembly 106 prior to the current usage cycle are different from the voltage and current offsets associated with the bin number with the largest bin count, the scanning device 102 may transmit a charging signal to the charging station 104 to increase, decrease, or leave unchanged the voltage and current offsets used to charge the battery assembly 106 after the current usage cycle. Leaving unchanged, increasing, or decreasing the voltage and current offsets may be included in the charging signal transmitted from the scanning device 102 to the charging station 104. Moreover, the scanning device 102 may determine that the voltage or current offsets should be decreased based on the operating temperature of the battery assembly 106. As discussed herein, the scanning device 102 may receive the operating temperature of the battery assembly 106 from a temperature sensor included in the scanning device 102, the charging station 104, or any other location or device suitable to measure temperature.

Moreover, in certain embodiments, the voltage and current offsets may correspond to two usage ranges of a device (e.g., scanning device 102). Namely, a first usage range may prioritize a long service life for the scanning device 102 by using reduced charging voltages and currents. A second usage range may prioritize a long runtime for the scanning device 102 by using increased charging voltages and currents. In these embodiments, the boundaries of the first usage range and/or the second usage range may be malleable and subject to change over time as the usage of the scanning device 102 changes, the scanning device 102 ages, the scanning device 102 is consistently exposed to high operating temperatures, or based on any other suitable influence over the performance of the scanning device's 102 battery assembly 106. These changes to the boundaries of the first usage range and/or the second usage range may be based on historical data, real-time data, or any combination therein.

It should additionally be understood that, in certain embodiments, any of the blocks of method 300 performed by the scanning device 102 may additionally or alternatively be performed by the charging station 104.

Figure 4:
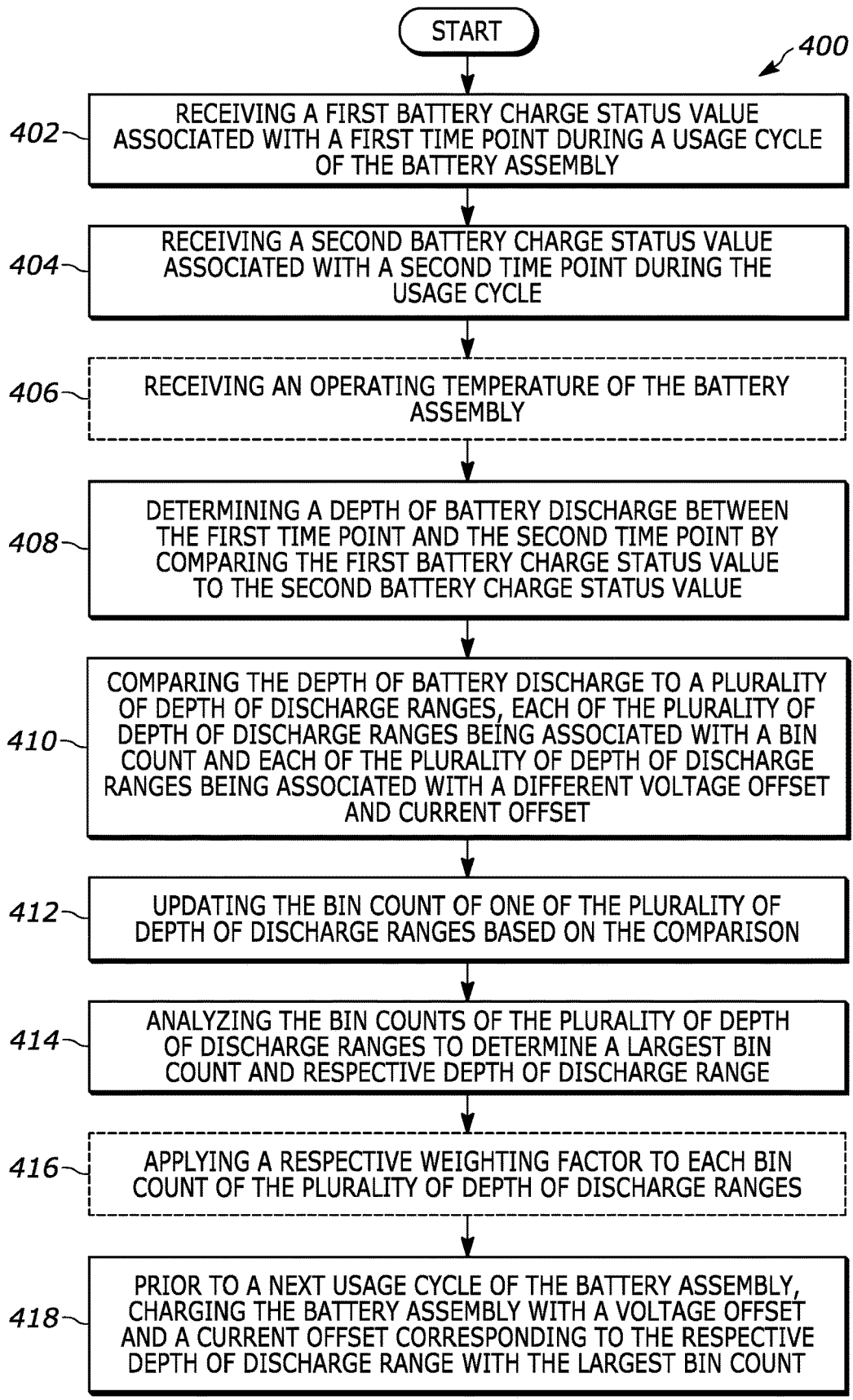
FIG. 4 illustrates another example method for dynamically modifying charging settings for a battery assembly, in accordance with various embodiments of the present invention.

FIG. 4 illustrates another example method for dynamically modifying charging settings for a battery assembly, in accordance with various embodiments of the present invention. The method 400 begins at block 402, where, for example, a scanning device (e.g., scanning device 102) receives a first battery charge status value associated with a first time point during a usage cycle of the battery assembly (e.g., battery assembly 106).

At block 404, the method 400 includes receiving a second battery charge status value associated with a second time point during the usage cycle. Block 404 may be performed by, for example, the controller 114 of the scanning device 102.

At optional block 406, the method 400 includes receiving an operating temperature of the battery assembly 106. As discussed herein, the operating temperature of the battery assembly 106 may be determined by, for example, a temperature sensor included in a device (e.g., the scanning device 102) or an external temperature sensor configured to communicate with a charging station (e.g., charging station 104) or other communications receiving device. Optional block 406 may be performed by, for example, the controller 114 of the scanning device 102.

At block 408, the method 400 includes determining a depth of battery discharge between the first time point and the second time point by comparing the first battery charge status value to the second battery charge status value. The depth of battery discharge may be determined by subtracting the second usage value from the first usage value. For example, a scanning device 102 may be configured to determine the usage difference value. After the usage difference value is determined, the scanning device 102 may, for example, populate a table (e.g., battery usage value history table 232) or otherwise store the usage difference value in memory (e.g., memory 112) for the scanning device 102 or other suitable device to perform the remaining steps of the method 400.

To illustrate, the first usage value may be 80% indicating the device (e.g., scanning device 102) was 80% charged when the usage cycle began. In this example, the second usage value may be 35% indicating the scanning device 102 was 35% charged when the usage cycle ended. A charging station (e.g., charging station 104), or any other suitable device, may be configured to determine the depth of battery discharge by subtracting the 35% second usage value from the 80% first usage value, yielding a 45% depth of battery discharge. The scanning device 102 or other suitable device may, for example, store the 45% depth of battery discharge in a table (e.g., battery usage value history table 232) or otherwise store the depth of battery discharge in memory (e.g., memory 112) for the scanning device 102 or other suitable device to perform the remaining steps of the method 400.

At block 410, the method 400 includes comparing the depth of battery discharge to a plurality of depth of discharge ranges, each of the plurality of depth of discharge ranges being associated with a bin count and each of the plurality of depth of discharge ranges being associated with a different voltage offset and current offset. Block 410 may be performed by, for example, the processor 116 of the scanning device 102.

For example, the scanning device 102 may compare the depth of battery discharge to each of the plurality of depth of battery discharge ranges. However, the scanning device 102 may compare the depth of battery discharge to less than each of the plurality of depth of battery discharge ranges as well.

At block 412, the method 400 includes updating the bin count of one of the plurality of depth of discharge ranges based on the comparison. Each of the depth of battery discharge ranges may have a range of values included therein. For example, the depth of battery discharge ranges may include a first range from 0% to 50% and a second range from 51% to 100%. Additionally, the depth of battery discharge ranges may include those featured in the bin range delineations 210 of FIG. 2. Block 412 may be performed by, for example, the processor 116 of the scanning device 102. Moreover, the bin counts and plurality of depth of discharge ranges may be included in, for example, the usage history 118.

To illustrate, as mentioned above, if the plurality of battery usage ranges is a plurality of depth of battery discharge ranges, the depth of battery discharge may be, for example, 45%. The scanning device 102 may update the bin count of the depth of battery discharge range which includes 45%. For example, and with reference to FIG. 2, the scanning device 102 may update the bin count of bin number 5 because 45% falls within the range of 41% to 100%. Moreover, the scanning device 102 may be configured to update the bin count of a bin by 1 for any respective usage difference value, or by any suitable amount.

At block 414, the method 400 includes analyzing the bin counts of the plurality of depth of discharge ranges to determine a largest bin count and respective depth of discharge range. Block 414 may be performed by, for example, the processor 116 of the scanning device 102.

For example, the scanning device 102 may be configured to analyze the bin counts for each of the plurality of depth of battery discharge ranges. In reference to FIG. 2, the scanning device 102 may analyze the bin counts for bin numbers 1-5. As illustrated by the usage bin values 204, the scanning device 102 may determine that bin number 1 has a bin count of 13, bin number 2 has a bin count of 3, bin number 3 has a bin count of 0, bin number 4 has a bin count of 3, and bin number 5 has a bin count of 1. In this example, the bin counts for each of bins 1-5 may be representative of insertion cycles related to the scanning device 102, but it should be understood that the bin counts may be representative of any suitable metric, as discussed herein.

At optional block 416, the method 400 includes applying a respective weighting factor to each bin count of the plurality of depth of discharge ranges. In this block, the largest bin count corresponds to a largest weighted bin count. Optional block 416 may be performed by, for example, the processor 116 of the scanning device 102.

At block 418, the method 400 includes prior to a next usage cycle of the battery assembly 106, charging the battery assembly 106 with a voltage offset and a current offset corresponding to the respective depth of discharge range with the largest bin count. Block 418 may be performed by, for example, the charging station 104.

In various embodiments, charging the battery assembly 106 with the voltage offset and the current offset may further comprise determining that the respective depth of battery discharge range is different from a prior respective depth of battery discharge range. Determining that the respective depth of battery discharge range is different from a prior respective depth of battery discharge range may be performed by, for example, the processor 116 of the scanning device 102.

For example, and with reference to FIG. 2, the scanning device 102 may analyze the bin counts of each of the plurality of depth of discharge ranges and determine that bin number 1 has the largest bin count. Thus, the scanning device 102 may further determine whether the voltage and current offsets associated with the depth of discharge range corresponding to bin number 1 were the voltage and current offsets applied to charge the battery assembly 106 prior to the current usage cycle.

In these embodiments, charging the battery assembly 106 with the voltage offset and the current offset may additionally further comprise at least one of: decreasing a charging voltage if (i) the respective depth of battery discharge range is below a prior respective depth of battery discharge range or (ii) an operating temperature of the battery assembly 106 is above a threshold value; decreasing a charging current if (i) the respective depth of battery discharge range is below the prior respective depth of battery discharge range or (ii) the operating temperature of the battery assembly 106 is above the threshold value; increasing the charging voltage if the respective depth of battery discharge range is above a prior respective depth of battery discharge range; and increasing the charging current if the respective depth of battery discharge range is above the prior respective depth of battery discharge range.

In other words, based on the determination whether the voltage and current offsets used to charge the battery assembly 106 prior to the current usage cycle are different from the voltage and current offsets associated with the bin number with the largest bin count, the scanning device 102 may transmit a charging signal to the charging station 104 to increase, decrease, or leave unchanged the voltage and current offsets used to charge the battery assembly 106 after the current usage cycle. Leaving unchanged, increasing, or decreasing the voltage and current offsets may be included in the charging signal transmitted from the scanning device 102 to the charging station 104. Moreover, the scanning device 102 may determine that the voltage or current offsets should be decreased based on the operating temperature of the battery assembly 106. As discussed herein, the scanning device 102 may receive the operating temperature of the battery assembly 106 from a temperature sensor included in the scanning device 102, the charging station 104, or any other location or device suitable to measure temperature.

Moreover, in certain embodiments, the voltage and current offsets may correspond to two usage ranges of a device (e.g., scanning device 102). Namely, a first usage range may prioritize a long service life for the scanning device 102 by using reduced charging voltages and currents. A second usage range may prioritize a long runtime for the scanning device 102 by using increased charging voltages and currents. In these embodiments, the boundaries of the first usage range and/or the second usage range may be malleable and subject to change over time as the usage of the scanning device 102 changes, the scanning device 102 ages, the scanning device 102 is consistently exposed to high operating temperatures, or based on any other suitable influence over the performance of the scanning device's 102 battery assembly 106. These changes to the boundaries of the first usage range and/or the second usage range may be based on historical data, real-time data, or any combination therein.

It should additionally be understood that, in certain embodiments, any of the blocks of method 400 performed by the scanning device 102 may additionally or alternatively be performed by the charging station 104.

Figure 5:
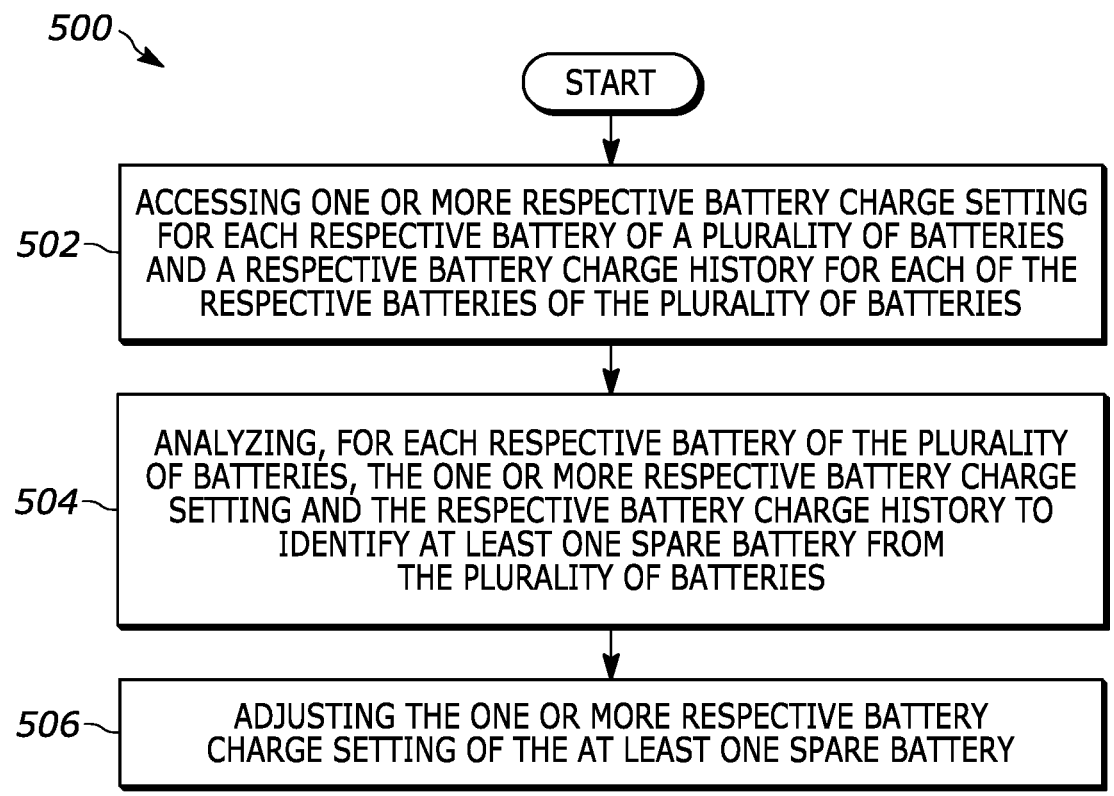
FIG. 5 illustrates an example method for dynamically identifying spare batteries in a battery assembly, in accordance with various embodiments of the present invention.

FIG. 5 illustrates an example method 500 for dynamically identifying spare batteries in a battery assembly, in accordance with various embodiments of the present invention. The method 500 begins at block 502, where, for example, a spare battery designation module (e.g., spare battery designation module 144) accesses one or more respective battery charge settings for each respective battery of a plurality of batteries and a respective battery charge history for each of the respective batteries of the plurality of batteries.

To illustrate, a terminal (e.g., terminal 102) may have a removable battery assembly (e.g., battery assembly 106), or simply a plurality of removable batteries used to power the terminal 102. In this example, a consumer may use the terminal 102 consistently over a period of time comprising a work cycle or shift (e.g., 5 hours per day during every workday). The consumer may consistently use a first battery (e.g., a primary battery) to power the terminal 102 during a majority of the terminal's 102 usage in the shift, and may remove the first battery once its charge is sufficiently depleted, to be replaced with a second battery. However, at the time of the replacement, the remaining time of any shift for the terminal 102 may be insufficient to fully deplete the charge of the second battery, and in particular, the second battery may be discharged to various different levels during different shifts. Thus, the respective battery charge history for the second battery may appear inconsistent when compared to the respective battery charge history for the first battery, and may feature fewer discharges below a certain range.

As an example, a consumer may habitually use the first battery to charge the terminal 102 from the beginning of every shift until the first battery has fully depleted its charge. In other words, the first battery may transition from 100% charge to 0% charge from the beginning of every shift to a point later in the same shift. Thus, the charging station used to replenish the first battery's charge (e.g., charging station 104, mobile charging station 132) may record the first battery's depth of discharge (e.g., 100%), and store that value in the usage history (128, 140).

At that point, and continuing the example, the consumer may replace the first battery with the second battery to continue operation of the terminal 102 during the shift. Prior to insertion into the terminal 102, the second battery may be, for example, at 100% charge. Once the shift ends, the consumer may remove the second battery and place it in a charging station (104, 132) so that both the first battery and the second battery are fully charged before the terminal's 102 next shift. However, the second battery may only have discharged 30%, so that 70% of the second battery's charge capacity remains prior to insertion in a charging station (104, 132). Hence, the charging station used to replenish the second battery's charge (104, 132) may record the second battery's depth of discharge (e.g., 30%), and store that value in the usage history (128, 140). It should be understood that the consumer may utilize the same second battery each time one is needed during a shift, or may utilize multiple different batteries over multiple different shifts, or any combination therein.

Problematically, and as discussed further herein, charging the second battery to full charge after only partial discharge (e.g., 30% in the preceding example) and maintaining full charge during much of the shift associated with a terminal 102 is harmful to the second battery. Ideally, the charging system will tailor the charging characteristics (e.g., charging voltage and current) for each battery to the known usage profile of each battery to prevent battery degradation. A first step toward achieving such tailored charging would be to access the known usage profile of each battery.

Correspondingly, at block 502, the spare battery designation module 144 accesses the one or more respective battery charge settings and the respective battery charge history for each respective battery. In some embodiments, the spare battery designation module 144 is included in one or more of a mobile battery charging unit (e.g., mobile charging station 132), a battery terminal (e.g., terminal 102), and each of the respective batteries of the plurality of batteries. In some embodiments, the spare battery designation module 144 accesses the one or more respective battery charge settings and the respective battery charge history by accessing each of the respective batteries of the plurality of batteries.

At block 504, the method 500 includes analyzing, for each respective battery of the plurality of batteries, the one or more respective battery charge settings and the respective battery charge history to identify at least one spare battery from the plurality of batteries. Block 504 may be performed by, for example, the spare battery designation module 144.

In some embodiments, identifying the at least one spare battery further comprises receiving a first indicator and a second indicator from the respective battery charge history. The identification may further include determining a difference indicator by comparing the first indicator to the second indicator, and comparing the difference indicator to a plurality of indicator ranges. The identification may also include updating an indicator range of the plurality of indicator ranges by placing the difference indicator in the indicator range, and analyzing the plurality of indicator ranges to determine a largest total number of difference indicators in a respective indicator range.

In some embodiments, the first indicator is a first state of charge (SOC), the second indicator is a second SOC, the difference indicator is a depth of discharge (DOD), the plurality of indicator ranges is a plurality of DOD ranges, the indicator range is a DOD range, the largest total number of difference indicators is a largest total number of insertion cycles, and the respective indicator range is a respective DOD range.

In some embodiments, the first indicator is a first time, the second indicator is a second time, and the difference indicator is a delayed usage indicator, the plurality of indicator ranges is a plurality of delayed usage indicator ranges, the indicator range is a delayed usage indicator range, the largest total number of difference indicators is a largest total number of delayed usage indicators, and the respective indicator range is a respective delayed usage indicator range. In these embodiments, the first time and second time may be represented by increments of time (e.g., days, hours, minutes, seconds, etc.), percentages of a terminal's 102 overall uptime (e.g., first battery used during 30% of terminal overall uptime), percentages of a particular terminal 102 shift (e.g., first battery used during 30% of terminal shift on Jan. 1, 2000), any other temporal metric, and/or any combination therein.

In some embodiments, the first indicator is a first charging location, the second indicator is a second charging location, and the difference indicator is a charging location indicator, the plurality of indicator ranges is a plurality of charging location indicator ranges, the indicator range is a charging location indicator range, the largest total number of difference indicators is a largest total number of charging location indicators, and the respective indicator range is a respective charging location indicator range. For example, the first and second charging locations may indicate respective charging times in the charging station 104 and the mobile charging station 132 (e.g., days, hours, minutes, seconds, etc.), percentages of time spent in the charging station 104 and the mobile charging station 132 (e.g., 30% in 104 and 70% in 132), any other useful metric, and/or any combination therein.

To illustrate, and in accordance with the example described in reference to block 502, the spare battery designation module 144 may analyze the respective battery charge settings and histories for the first battery and the second battery. In embodiments where the first and second indicators are SOC and the difference indicator is a DOD, the spare battery designation module 144 may retrieve information from the usage histories (128, 140) indicating that the first battery consistently discharges from 100% to 0% (e.g., a 100% DOD) between insertion cycles. Similarly, the spare battery designation module 144 may retrieve information from the usage histories (128, 140) indicating that the second battery consistently discharges from 100% to 70% (e.g., a 30% DOD) between insertion cycles. Based on this information, the spare battery designation module 144 may identify the first battery as the primary battery for the terminal 102, and may identify the second battery as the spare battery for the terminal 102.

As another example, the spare battery designation module 144 may analyze the respective battery charge settings and histories for the first battery and the second battery in embodiments where the first and second indicators are time and the difference indicator is a delayed usage indicator. In these embodiments, the spare battery designation module 144 may retrieve information from the usage histories (128, 140) indicating that the first battery is consistently used for the first 80% of the terminal's 102 uptime. Correspondingly, the spare battery designation module 144 may retrieve information from the usage histories (128, 140) indicating that the second battery is consistently used for the remaining 20% of the terminal's 102 uptime (e.g., a delayed usage indicator of 80%). Based on this information, the spare battery designation module 144 may identify the first battery as the primary battery for the terminal 102, and may identify the second battery as the spare battery for the terminal 102.

As yet another example, the spare battery designation module 144 may analyze the respective battery charge settings and histories for the first battery and the second battery in embodiments where the first and second indicators are charging locations and the difference indicator is a charging location indicator. In these embodiments, the spare battery designation module 144 may retrieve information from the usage histories (128, 140) indicating that the first battery is primarily charged in the charging station 104. Correspondingly, the spare battery designation module 144 may retrieve information from the usage histories (128, 140) indicating that the second battery is primarily charged in the mobile charging station 132. Based on this information, the spare battery designation module 144 may identify the first battery as the primary battery for the terminal 102, and may identify the second battery as the spare battery for the terminal 102.

At block 506, the method 500 includes adjusting the one or more respective battery charge settings of the at least one spare battery. The one or more respective battery charge settings may include for each respective battery, for example, a charging voltage, a charging current, and/or a SOC. The SOC may reference either a capacity of the at least one spare battery in milliamp-hours (mAh) or a percentage of the at least one battery's maximum charge capacity. For example, and in some embodiments, the one or more respective battery charge settings include at least a maximum charge capacity and a maximum allowable charge capacity. In these embodiments, adjusting the one or more respective battery charge settings of the at least one spare battery further comprises reducing the maximum allowable charge capacity from 100% of the maximum charge capacity to less than or equal to 90% of the maximum charge capacity. Thus, the SOC would correspond to 90% of the maximum charge capacity.

It should be appreciated that adjusting the one or more respective battery charge settings of the at least one spare battery may include reducing the maximum allowable charge capacity from 100% of the maximum charge capacity to less than or equal to any suitable percentage of the maximum charge capacity. For example, adjusting the one or more respective battery charge settings of the at least one spare battery may include reducing the maximum allowable charge capacity from 100% of the maximum charge capacity to less than or equal to 10%, 20%, 30%, 40%, 50%, 60%, 70%, 80%, 99%, and/or any other suitable percentage of the maximum charge capacity.

In some embodiments, the respective battery charge history includes one or more past respective battery charge settings for a respective battery of the plurality of batteries. In these embodiments, the method 500 further comprises updating the respective battery charge history by including the one or more respective battery charge settings of the at least one spare battery. These updates may be performed, for example, by the spare battery designation module 144, and may be performed after adjusting the one or more respective battery charge settings of the at least one spare battery. Block 506 may be performed by, for example, the spare battery designation module 144.

To illustrate, and in accordance with the example described in reference to block 502 and 504, the spare battery designation module 144 may adjust the one or more respective battery charge settings of the at least one spare battery by adjusting the battery charge settings of the second battery. The spare battery designation module 144 may decrease the charging voltage and charging current of the second battery to avoid the degradation that occurs when batteries are charged at high voltages and currents. Additionally, in some embodiments, the spare battery designation module 144 may decrease the maximum allowable charge capacity of the second battery from 100% to 90%.

With these changes, the spare battery designation module 144 will extend the service life of the second battery by minimizing harmful charging practices, as described further herein. Moreover, the adjusted battery charge settings for the spare battery or any other battery in the plurality of batteries may be distributed to all associated charging stations (e.g., charging station 104, mobile charging station 132), terminals (e.g., terminal 102), and any other connected components to ensure that the adjusted battery charge settings will be applied to the respective battery regardless of the respective battery's insertion to new and/or different system (e.g., example system 110, example system 131) components.

It should be understood that various aspects of both dynamically modifying charging settings for a battery assembly and dynamically identifying spare batteries may be performed independently, simultaneously, or any combination therein, by various embodiments of the present application. Moreover, it should be appreciated that while the spare battery designation module 144, as illustrated in FIG. 1C, is included in the terminal 102, the spare battery designation module 144 may also be included in the charging station 104, the mobile charging station 132, and/or an external terminal, computer, or server configured to receive the respective battery charge settings and respective battery charge histories for each respective battery of the plurality of batteries.

The terms transmitter, receiver, and transceiver are used herein for example purposes and should not be construed as limiting. For example, it will be understand that references to an element being a transmitter or a receiver include that element being a transceiver. Furthermore, any reference to an element being a transceiver may include that element being implemented as a transmitter and/or receiver depending on whether the element is sending and/or receiving data.

In some embodiments, the charge systems and methods described herein can be implemented in connection with batteries that are preconfigured for various modes of operation. In other words, rather than differentiating between primary and spare batteries, at least some of the concepts described herein can be implemented in connection with batteries that are optimized for runtime and with batteries optimized for long service life. For this, the battery assembly may be preconfigured with a particular indicator signaling whether the battery has been designed to be used as a battery optimized for runtime or as a battery optimized for long service life. When the battery is preconfigured to be optimized for runtime, the battery and/or the charging station may function so as to charge the battery at a first voltage, current, and/or charge capacity that is, in some embodiments, at or close to the battery's maximum operational capacity. When the battery is preconfigured to be optimized for long service life, the battery and/or the charging station may function so as to charge the battery at a second voltage, current, and/or charge capacity that is lower than the first voltage, current, and/or charge capacity. For example, when the battery is preconfigured to be optimized for long service life, the battery and/or the charging station may function to charge the battery to less than or equal to 10%, 20%, 30%, 40%, 50%, 60%, 70%, 80%, 99%, and/or any other suitable percentage of the maximum charge capacity. This can be achieved by way of circuitry/firmware (e.g., controller) internal to the battery that allows for the battery to draw the appropriate electrical power regardless of the charging station output. For instance, in cases where the battery is preconfigured to be optimized for long service life and is configured to charge to a second charge capacity of 80% of its maximum capacity, the internal battery circuitry/firmware may cause an electrical discontinuity between the electrical contacts on the battery (that come into contact with the contacts of the charging station) and the power storage element of the battery. In other instances, the charge station may be configured to recognize the preconfigured state of the battery and provide the appropriate charge characteristics. For instance, in cases where the battery is preconfigured to be optimized for long service life and is configured to charge with a second current of 0.5 amps., the charging station, despite being operable to output a charge current greater than 0.5 amps., includes internal circuitry/firmware that limits the charge current 0.5 amps.

The aforementioned approach can also be implemented at the discharge stage. Since battery life may be shorted by discharging the battery to or around its lowest specified operable charge level, in instances where the battery is preconfigured to be optimized for long service life, it is desirable to provide a "battery empty" signal (or otherwise indicate a drained battery) well before the battery charge level drops to the lowest specification level. Thus, when the battery is preconfigured to be optimized for runtime, the battery and/or the device in which the battery is used may function so as to indicate a depleted battery when the battery charge drops to or around a first charge level that is in some embodiments the minimum operational charge level permitted by the battery specification. On the other hand, when the battery is preconfigured to be optimized for long service life, the battery and/or the device in which the battery is used may function so as to indicate a depleted battery when the battery charge drops to or around a second charge level that is greater than the first charge level. In some embodiments, the second charge level may be greater than or equal to the first charge level by 5%, 10%, 20%, 30%, 40%, 50%, 60%, 70%, and/or any other suitable percentage.

This functionality may be achieved by way of circuitry/firmware (e.g., controller) provided within the battery and/or the device within which the battery is used. For example, when the battery is preconfigured to be optimized for long service life, circuitry/firmware within the battery may sense a charge level and upon said charge level reaching some preconfigured minimum level, the internal battery circuitry/firmware may provide a signal indicating that the battery is approaching a minimum operational charge and/or that such level has been reached. In other instances, the internal battery circuitry/firmware may consider the useable range of power capacity as the reported range from maximum charge (e.g., 100%) to a minimum charge (e.g., 0%) and output the reported range when in use. Thus, if the battery is optimized such that its maximum charge level is limited to 80% of its overall charge capacity and its minimum operational charge level is set at 20% of its overall charge capacity, the reported charge level ranging from 100% to 0% will be based on the overall charge level being within the useable 60% range from 80% to 20%. In such case, the battery being charged at 80% of its total capacity will be reported as a 100% charge, the battery being charged at 65% of its total capacity will be reported as a 75% charge, the battery being charged at 50% of its total capacity will be reported as a 50% charge, the battery being charged at 35% of its total capacity will be reported as a 25% charge, and the battery being charged at 20% of its total capacity will be reported as a 0% charge. This approach may be beneficial from the point of view that it might not require any alteration to the device within which the battery is being used. Still, such functionality can also be implemented by circuitry that and/or software/firmware within the device using a battery. In this case, the device may be configured to recognize that a particular battery installed within the device has been preconfigured to be optimized for long service life. Upon such recognition, the device itself may report a battery level that is based on a predetermined range (that could be programmed either into the battery or the device). Thus, if the device recognizes that the installed battery is preconfigured to operate within the range of 20%-80% of its total charge capacity, the device may report, or otherwise consider, the real-time charge level based on said range. As such, similar to the case above, the battery being charged at 80% of its total capacity will be reported as a 100% charge, the battery being charged at 65% of its total capacity will be reported as a 75% charge, the battery being charged at 50% of its total capacity will be reported as a 50% charge, the battery being charged at 35% of its total capacity will be reported as a 25% charge, and the battery being charged at 20% of its total capacity will be reported as a 0% charge. It should, however, be appreciated that actual reporting of the battery charge is not required and the device may simply provide a "low battery" indicator when the reported charge reached a predetermined range (e.g., less than 30% of the total charge capacity) and/or the device may turn off when the reported charge reaches at or about 0% (e.g., 20% of the total charge capacity if used with the example recited above).

While in some cases the preconfiguration of the battery as being optimized for long service life or runtime may be achieved solely by way of circuitry/firmware, in other instances such differentiation may be achieved by or with the assistance of of mechanical indicators. In some embodiments, these mechanical indicators can include, but are not limited to, the thickness of the electrical contacts on the battery, the material used for the electrical contacts and the material's electrical resistance, susceptibility to oxidation, and/or material's resistance to wear, the addition of contact inlays (e.g., paliney), housing material, and/or alignment features provided on the housing. Any one of these features can be provided in a manner that the detection thereof and an association of said mechanical feature with a specific preconfiguration can trigger and battery/charge station or battery/device to operate in a manner specified above.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. Additionally, the described embodiments/examples/implementations should not be interpreted as mutually exclusive, and should instead be understood as potentially combinable if such combinations are permissive in any way. In other words, any feature disclosed in any of the aforementioned embodiments/examples/implementations may be included in any of the other aforementioned embodiments/examples/implementations.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method for dynamically modifying charging settings for a battery assembly, comprising:
   receiving a first usage value for the battery assembly associated with a beginning time point of a usage cycle;
   receiving a second usage value for the battery assembly associated with an ending time point of the usage cycle;
   determining a usage difference value for the battery assembly by comparing the first usage value to the second usage value;
   comparing the usage difference value to a plurality of battery usage ranges, each of the battery usage ranges being associated with a bin count and each of the battery usage ranges being associated with a different voltage offset and current offset;
   updating the bin count of one of the plurality of battery usage ranges based on the comparison;
   analyzing the bin counts of the plurality of battery usage ranges to determine a largest bin count and a respective battery usage range; and
   prior to a next usage cycle of the battery assembly, charging the battery assembly with a voltage offset and a current offset corresponding to the respective battery usage range with the largest bin count.

2. The method of claim 1, further comprising:
   applying a respective weighting factor to each bin count of the plurality of battery usage ranges; and
   wherein the largest bin count corresponds to a largest weighted bin count.

3. The method of claim 1, further comprising:
   receiving an operating temperature of the battery assembly; and
   wherein charging the battery assembly with the voltage offset and the current offset further comprises:
      determining that the respective battery usage range is different from a prior respective battery usage range; and
      at least one of:
         decreasing a charging voltage if (i) the respective battery usage range is below a prior respective battery usage range or (ii) the operating temperature of the battery assembly is above a threshold value;
         decreasing a charging current if (i) the respective battery usage range is below the prior respective battery usage range or (ii) the operating temperature of the battery assembly is above the threshold value;
         increasing the charging voltage if the respective battery usage range is above a prior respective battery usage range; and
         increasing the charging current if the respective battery usage range is above the prior respective battery usage range.

4. The method of claim 1, wherein the first usage value is at least one of (i) a first time and (ii) a first number of scans, the second usage value is at least one of (i) a second time and (ii) a second number of scans, the usage difference value is at least one of (i) a time between charges and (ii) a scan number difference, the plurality of battery usage ranges is at least one of (i) a plurality of time between charges ranges and (ii) a plurality of scan number difference ranges, the largest bin count is a largest number of insertion cycles, and the respective battery usage range is at least one of (i) a respective time between charges range and (ii) a respective scan number difference range.

5. The method of claim 1, wherein the first usage value is a first battery charge status value, the second usage value is a second battery charge status value, the usage difference value is a depth of battery discharge, the plurality of battery usage ranges is a plurality of depth of battery discharge ranges, the largest bin count is a largest number of insertion cycles, and the respective battery usage range is a respective depth of battery discharge range.

6. The method of claim 5, wherein charging the battery assembly with the voltage offset and the current offset further comprises:
   determining that the respective depth of battery discharge range is different from a prior respective depth of battery discharge range; and
   at least one of:
      decreasing a charging voltage if (i) the respective depth of battery discharge range is below a prior respective depth of battery discharge range or (ii) an operating temperature of the battery assembly is above a threshold value;
      decreasing a charging current if (i) the respective depth of battery discharge range is below the prior respective depth of battery discharge range or (ii) the operating temperature of the battery assembly is above the threshold value;
      increasing the charging voltage if the respective depth of battery discharge range is above a prior respective depth of battery discharge range; and
      increasing the charging current if the respective depth of battery discharge range is above the prior respective depth of battery discharge range.

7. A method for dynamically modifying charging settings for a battery assembly, comprising:
   receiving a first battery charge status value associated with a first time point during a usage cycle of the battery assembly;
   receiving a second battery charge status value associated with a second time point during the usage cycle;
   determining a depth of battery discharge between the first time point and the second time point by comparing the first battery charge status value to the second battery charge status value;
   comparing the depth of battery discharge to a plurality of depth of discharge ranges, each of the plurality of depth of discharge ranges being associated with a bin count and each of the plurality of depth of discharge ranges being associated with a different voltage offset and current offset;
   updating the bin count of one of the plurality of depth of discharge ranges based on the comparison;
   analyzing the bin counts of the plurality of depth of discharge ranges to determine a largest bin count and respective depth of discharge range; and
   prior to a next usage cycle of the battery assembly, charging the battery assembly with a voltage offset and a current offset corresponding to the respective depth of discharge range with the largest bin count.

8. The method of claim 7, further comprising:
   applying a respective weighting factor to each bin count of the plurality of depth of discharge ranges; and
   wherein the largest bin count corresponds to a largest weighted bin count.

9. The method of claim 7, wherein charging the battery assembly with the voltage offset and the current offset further comprises:
   receiving an operating temperature of the battery assembly;
   determining that the respective depth of discharge range is different from a prior respective depth of discharge range; and
   at least one of:
      decreasing a charging voltage if (i) the respective depth of discharge range is below the prior respective depth of discharge range or (ii) an operating temperature of the battery assembly is above a threshold value;
      decreasing a charging current if (i) the respective depth of discharge range is below the prior respective depth of discharge range or (ii) the operating temperature of the battery assembly is above the threshold value;
      increasing the charging voltage if the respective depth of discharge range is above a prior respective depth of discharge range; and
      increasing the charging current if the respective depth of discharge range is above the prior respective depth of discharge range.

10. The method of claim 7, wherein the first battery charge status value is at least one of (i) a first time and (ii) a first number of scans, the second battery charge status value is at least one of (i) a second time and (ii) a second number of scans, the depth of battery discharge is at least one of (i) a time between charges and (ii) a scan number difference, the plurality of depth of discharge ranges is at least one of (i) a plurality of time between charges ranges and (ii) a plurality of scan number difference ranges, the largest bin count is a largest number of insertion cycles, and the respective depth of discharge range is at least one of (i) a respective time between charges range and (ii) a respective scan number difference range.

11. A system for dynamically modifying charging settings, comprising:
   a charging station; and
   a scanning device comprising a battery assembly, wherein the scanning device is configured to be communicatively coupled with the charging station, and wherein the scanning device is further configured to:
      receive a first usage value for the battery assembly associated with a beginning time point of a usage cycle;
      receive a second usage value for the battery assembly associated with an ending time point of the usage cycle;
      determine a usage difference value for the battery assembly by comparing the first usage value to the second usage value;
      compare the usage difference value to a plurality of battery usage ranges, each of the battery usage ranges being associated with a bin count and each of the battery usage ranges being associated with a different voltage offset and current offset;
      update the bin count of one of the plurality of battery usage ranges based on the comparison;

analyze the bin counts of the plurality of battery usage ranges to determine a largest bin count and a respective battery usage range; and prior to a next usage cycle of the battery assembly, transmit a charging signal to the charging station to cause the charging station to charge the battery assembly with a voltage offset and a current offset corresponding to the respective battery usage range with the largest bin count.

12. The system of claim 11, wherein the beginning time point is associated with decoupling the scanning device from the charging station, and wherein the ending time point is associated with coupling the scanning device with the charging station.

13. The system of claim 11, wherein the battery assembly includes one or more of (i) lithium ion batteries, (ii) lithium ion super capacitors, and (iii) electrical double layer capacitor super capacitors.

14. The system of claim 11, wherein the scanning device is further configured to:

apply a respective weighting factor to each bin count of the plurality of battery usage ranges; and wherein the largest bin count corresponds to a largest weighted bin count.

15. The system of claim 11, wherein the scanning device is further configured to:

receive an operating temperature of the battery assembly;

determine that the respective battery usage range is different from a prior respective battery usage range; and at least one of:

decrease a charging voltage if (i) the respective battery usage range is below a prior respective battery usage range or (ii) the operating temperature of the battery assembly is above a threshold value, the decrease being included in the charging signal;

decrease a charging current if (i) the respective battery usage range is below the prior respective battery usage range or (ii) the operating temperature of the battery assembly is above the threshold value, the decrease being included in the charging signal;

increase the charging voltage if the respective battery usage range is above a prior respective battery usage range, the increase being included in the charging signal; and increase the charging current if the respective battery usage range is above the prior respective battery usage range, the increase being included in the charging signal.

16. The system of claim 11, wherein the first usage value is at least one of (i) a first time and (ii) a first number of scans, the second usage value is at least one of (i) a second time and (ii) a second number of scans, the usage difference value is at least one of (i) a time between charges and (ii) a scan number difference, the plurality of battery usage ranges is at least one of (i) a plurality of time between charges ranges and (ii) a plurality of scan number difference ranges, the largest bin count is a largest number of insertion cycles, and the respective battery usage range is at least one of (i) a respective time between charges range and (ii) a respective scan number difference range.

17. The system of claim 11, wherein the charging station includes a default optimization, and wherein the default optimization provides an extended runtime of the battery assembly.

18. The system of claim 11, wherein the charging station includes:

one or more memories;

one or more processors; and a controller operatively coupled to the one or more memories and the one or more processors.

19. The system of claim 11, wherein the first usage value is a first battery charge status value, the second usage value is a second battery charge status value, the usage difference value is a depth of battery discharge, the plurality of battery usage ranges is a plurality of depth of battery discharge ranges, the largest bin count is a largest number of insertion cycles, and the respective battery usage range is a respective depth of battery discharge range.

20. The system of claim 19, wherein the scanning device is further configured to:

determine that the respective depth of battery discharge range is different from a prior respective depth of battery discharge range; and at least one of:

decrease a charging voltage if (i) the respective depth of battery discharge range is below the prior respective depth of battery discharge range or (ii) an operating temperature of the battery assembly is above a threshold value, the decrease being included in the charging signal;

decrease a charging current if (i) the respective depth of battery discharge range is below the prior respective depth of battery discharge range or (ii) the operating temperature of the battery assembly is above the threshold value, the decrease being included in the charging signal;

increase the charging voltage if the respective depth of battery discharge range is above a prior respective depth of battery discharge range, the increase being included in the charging signal; and increase the charging current if the respective depth of battery discharge range is above the prior respective depth of battery discharge range, the increase being included in the charging signal.

* * * * *